(12) United States Patent
Ono (10) Patent No.: US 6,906,334 B2
(45) Date of Patent: Jun. 14, 2005

(54) CURVED I-CORE (75) Inventor: Kazuya Ono, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 264 days.

(21) Appl. No.: 09/741,264

(22) Filed: Dec. 19, 2000

(65) Prior Publication Data

US 2002/0074510 A1 Jun. 20, 2002

(51) Int. Cl.$^7$ ................................ G03B 27/42
(52) U.S. Cl. .................. 250/442.11; 355/53; 355/72
(58) Field of Search ................... 250/442.11, 400, 250/396 ML, 491.1; 355/53, 72; 310/12

(56) References Cited

U.S. PATENT DOCUMENTS

| 5,294,854 | A | * | 3/1994 | Trumper | 310/90.5 |
| 5,473,410 | A | | 12/1995 | Nishi | |
| 5,528,118 | A | | 6/1996 | Lee | |
| 5,874,820 | A | | 2/1999 | Lee | |
| 5,949,161 | A | * | 9/1999 | Nanba | 310/12 |
| 6,069,417 | A | * | 5/2000 | Yuan et al. | 310/12 |
| 6,281,655 | B1 | * | 8/2001 | Poon et al. | 318/649 |
| 6,307,285 | B1 | * | 10/2001 | Delson et al. | 310/14 |
| 6,313,551 | B1 | * | 11/2001 | Hazelton | 310/12 |
| 6,323,494 | B1 | * | 11/2001 | Lee | 250/442.11 |
| 6,323,567 | B1 | * | 11/2001 | Hazelton et al. | 310/12 |
| 6,472,777 | B1 | * | 10/2002 | Teng et al. | 310/12 |
| 6,486,941 | B1 | * | 11/2002 | Hazelton et al. | 355/72 |
| 6,570,645 | B2 | | 5/2003 | Korenaga et al. | |
| 2002/0048009 | A1 | * | 4/2002 | Kwan | 355/72 |

FOREIGN PATENT DOCUMENTS

WO    WO01/81171    11/2001

* cited by examiner

Primary Examiner—Nikita Wells
Assistant Examiner—Anthony Quash
(74) Attorney, Agent, or Firm—Liu & Liu (57) ABSTRACT An actuator has a pair of electromagnets and a curved magnetic member that is magnetically coupled to the electromagnets. The magnetic force acting on the curved magnetic member has less of a tendency to induce torque to the table than a straight magnetic member, because the geometry of the magnetic force between the curved magnetic member and electromagnets remain relatively unchanged over the permitted range of movement of the magnetic member.

28 Claims, 7 Drawing Sheets

CURVED I-CORE

BACKGROUND OF THE INVENTION

1. Field of the Invention

The invention relates generally to a positioning apparatus and a positioning method for use in photolithography, among other applications. More particularly, the invention is directed to a positioning apparatus for a wafer table, the positioning apparatus including an electromagnetic bearing system which effectively provides fine position control of the wafer table.

2. Description of Related Art

Many applications, particularly in semiconductor manufacturing, require precision positioning of an object. They include scanning tunneling microscopy, optical inspection, and photolithography. During photolithography, a wafer table is commonly used to position a wafer precisely with respect to the photolithographic apparatus.

The positioning and alignment of the wafer table can be performed in various ways. In U.S. Pat. No. 5,294,854, the entire contents of which are incorporated by reference herein, an electromagnetic bearing system is used for fine position control of the wafer table. The electromagnetic bearing system used in this patent allows for positioning and movement control of the wafer table in multiple degrees of freedom. Specifically, the wafer table is moved into desired positions by applying different currents to electromagnets that interact with corresponding adjacent magnetic members that are attached to the wafer table.

Figure 4:
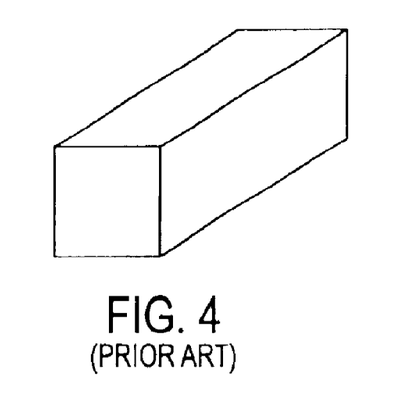
FIG. 4 is a perspective view of a prior art I-shaped magnetic member.

The magnetic members disclosed in the '854 patent have a rectangular shape (see FIG. 4). When the wafer table is moved horizontally (e.g., in the X- or Y-direction) and vertically (in the Z-direction), the wafer table sometimes becomes tilted. When the wafer table becomes tilted, the magnetic member becomes tilted with respect to the electromagnets, and the gap distance between the magnetic member and the electromagnets differs along the height of the magnetic member. The difference in the gap distances in turn causes the magnetic coupling across the magnetic member to change and a torque develops along the magnetic member. The resulting torque can affect the precision positioning of the wafer table, and so, to compensate for this torque, additional electrical current is applied to the electromagnets.

While the prior art attempts to solve the torque problem by adjusting the electrical current in the electromagnets, this can result in unnecessary wafer table flutter, an increase in the chance of inducing distortion to the wafer table, and undesirable heat in the electromagnet bearing and the attached members. Therefore, it is desirable to have an electromagnetic bearing system that can minimize the torque created along the magnetic member.

SUMMARY OF THE INVENTION

The present invention overcomes the drawbacks of the prior art by implementing an actuator device or a magnetic bearing, which permits relatively uniform magnetic coupling over the permitted range of movement of the magnetic member during electromagnetic actuation.

In one aspect of the invention, the actuator device comprises of a first member that includes at least one electromagnet and a second member that is magnetically coupled to the first member by a force generated by the at least one electromagnet, the second member including a curved outer periphery facing the at least one electromagnet generating the force. In another aspect of the invention, the actuator device comprises of a first member that includes at least one electromagnet and a second member that is magnetically coupled to the first member and movable relative to the first member by a force generated by the at least electromagnet, wherein a relative motion between the first member and the second member includes a relative movement in a first direction that differs from a second direction parallel with the direction of the force acting on the second member; and the force between the second member and the at least one electromagnet remains substantially same amount over the relative movement between the first member and the second member in the first direction. In a further aspect of the present invention, a lithography system is disclosed which deploys a stage system that incorporates the actuator device in accordance with the present invention.

In accordance with one application of this invention, a wafer table is provided with a surface that is positionally controllable in at least one degree of freedom (e.g. for photolithography). At least one magnetic member attached to the wafer table couples the wafer table to a wafer positioning stage via electromagnetic actuators that are attached to the wafer positioning stage. The electromagnetic actuation of the magnetic member controls the horizontal movement of the wafer table in at least one degree of freedom. The magnetic bearing system in accordance with this invention depends on the interaction of the magnetic member and the electromagnetic actuators for positioning the wafer table. The magnetic bearing system in accordance with the principles of this invention comprises of an electromagnetic actuator that are primarily a pair of electromagnetic cores and a magnetic member with curved surface. The electromagnetic core is typically an E-shaped laminated core, with wire coils wound around its center prong. Current is to flow through the coil to actuate this E-shaped electromagnetic actuator. The magnetic member is preferably of spherical shape, cylindrical or at least having a convex curved outer surface. The magnetic force acting on the curved magnetic member has less of a tendency to induce torque to the wafer table because the geometry of magnetic force between the curved magnetic member and electromagnetic actuator remain relatively unchanged over the permitted range of movement of the magnetic member. This provides for a relatively uniform magnetic coupling over the range of movement of the magnetic member, thus reducing torque generated across the magnetic member.

DETAILED DESCRIPTION OF THE PREFERRED EMBODIMENT

This invention is described in a preferred embodiment in the following description with references to the following figures. While the invention is described in terms of best mode of achieving this invention's objectives, it will be appreciated by those skilled in the art that variations may be accomplished in view of these teachings without deviating from the spirit or scope of the invention.

The electronic bearing of the present invention can be implemented to control movements of an object in many types of systems. In particular, the present invention is used to control the movement of a wafer table in a photolithography system. The invention is applicable to a scanning type photolithography system (see, for example U.S. Pat. No. 5,473,410, the entire contents of which are incorporated by reference herein), which exposes a mask pattern by moving a mask and a substrate synchronously. It is also applicable to a step-and-repeat type photolithography system that exposes a mask pattern while a mask and a substrate are stationary and moves the substrate in successive steps for exposure. It is further applicable to a proximity photolithography system that exposes a mask pattern by closely locating a mask and a substrate without the use of a projection optical system. The use of a photolithography system need not be limited to a photolithography system in semiconductor manufacturing. For instance, it can be widely applied to an LCD photolithography system, which exposes a liquid crystal display device pattern onto a rectangular glass plate, and a photolithography system for manufacturing a thin film magnetic head.

Figure 1:
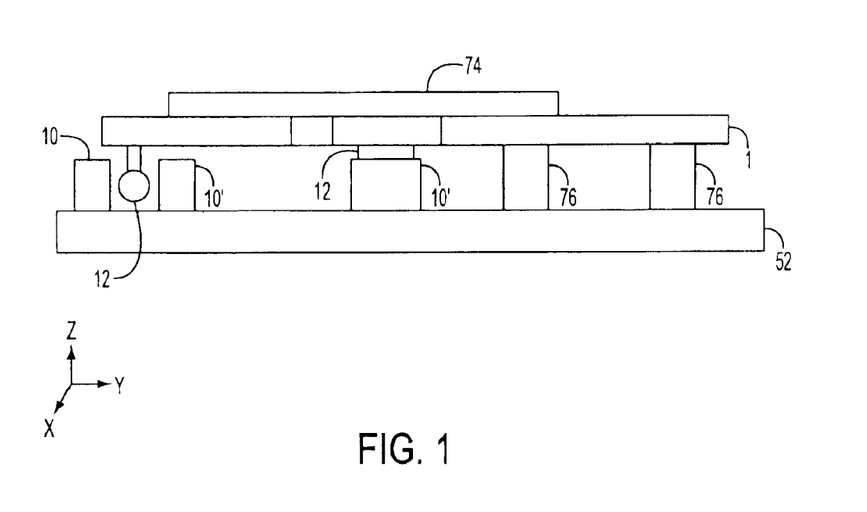
FIG. 1 is a schematic view illustrating the wafer positioning stage and table of a photolithography apparatus incorporating the electromagnetic bearing system in accordance with one embodiment of the present invention.

FIG. 1 is a schematic view illustrating the electromagnetic bearing system in accordance with one embodiment of the present invention. As shown in the figure, a wafer table 1 is magnetically coupled to a wafer positioning stage 52 by pairs of electromagnetic actuators 10, 10', electromagnetic members 12, and voice coil motors 76. The positioning mechanism for the wafer table 1 is similar to the one described in International Application no. PCT/US00/10831, entitled "Wafer Stage With Magnetic Bearings," the contents of which are fully incorporated herein by reference. The positioning stage 52 provides small and precise movement of the wafer table 1 in the vertical plane (Z) and horizontal plane (X, Y). Voice coil motors 76 are used to control vertical movement because dynamic performance is not required (e.g., acceleration requirements are relatively low). To prevent overheating of the voice coil motors 76, air bellows (not shown) are used to support the dead weight of the wafer table 1.

Figure 2:
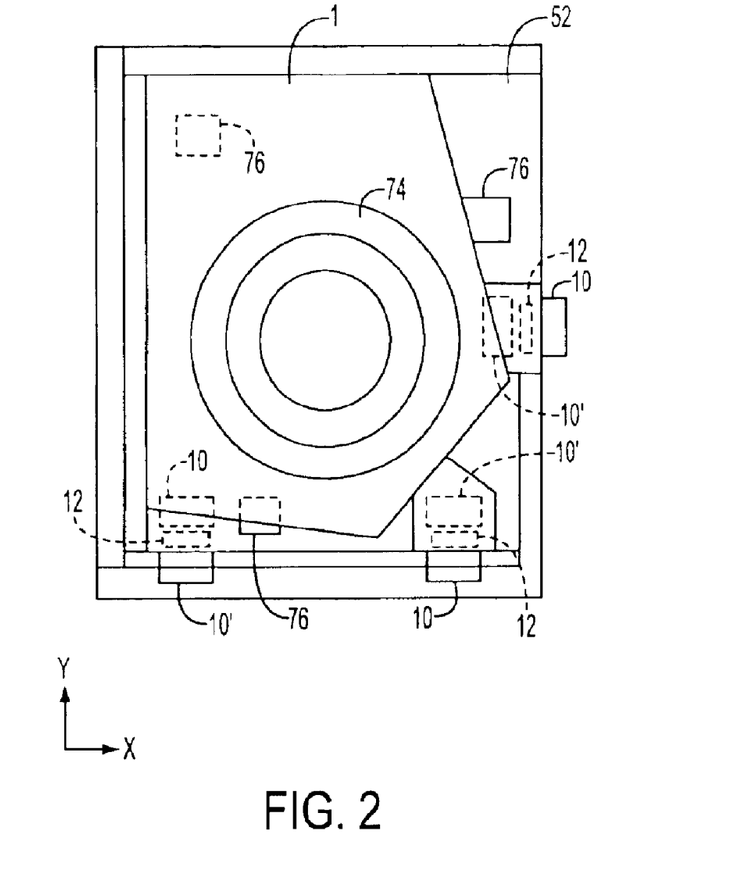
FIG. 2 is top view of the wafer table and wafer positioning stage.

The electromagnetic actuators or E-cores 10, 10' are attached to the wafer positioning stage 52 in pairs. Preferably, two pairs of E-cores 10, 10' are aligned parallel with the X-plane and one pair of the E-cores 10, 10' are aligned parallel with the Y-plane, forming a triangular pattern as shown in FIG. 2. Three electromagnetic members or I-cores 12 are attached to the wafer table 1, preferably towards the outer periphery. The I-cores 12 are positioned such that they align with and rest between, each pair of E-cores 10, 10'. The E-cores 10, 10' are assembled in pairs because they can only pull the I-core 12 in opposition.

Figure 3:
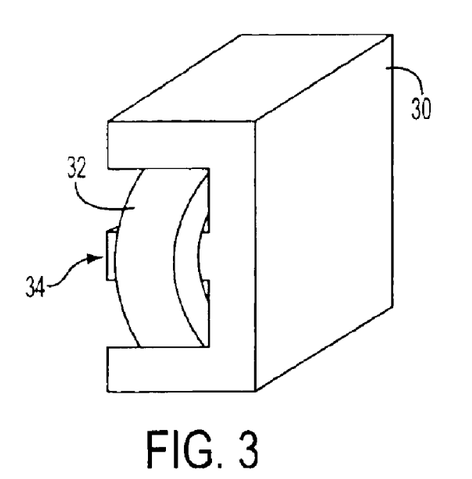
FIG. 3 is a perspective view of an E-shaped electromagnetic actuator in accordance with one embodiment of the present invention.

FIG. 3 is a perspective view of the E-core. The E-core typically comprises of an E-shaped laminated core 30 made of a magnetic material, such as iron or Ni-Fe steel. Electrical magnetic wire 32 is wound around the center prong 34 forming a coil.

Figure 5:
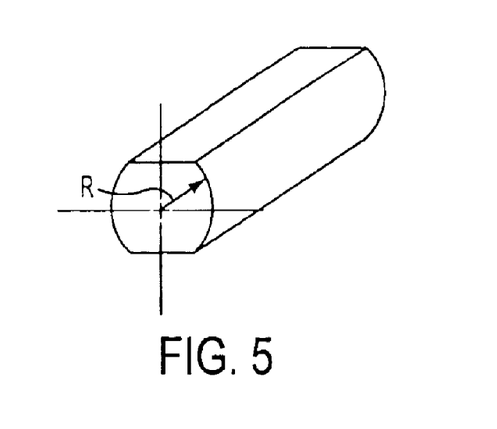
FIG. 5 is a perspective view of an I-shaped magnetic member in accordance with one embodiment of the present invention.

FIG. 5 is a perspective view of an I-core comprising of a cylindrically shaped magnetic material, preferably composed of the same material as the E-core. The shape of the I-core is not limited to the cylindrical shape, and may include, for example, circular shapes, spherical shapes, etc. The two sides of the I-core that face each E-core are in a shape that allows it to convex towards the E-cores. The overall size of the I-core is determined by the size of the E-core, but it is typically smaller than the E-core. The I-core must remain within the magnetic flux of the E-core.

Figure 6:
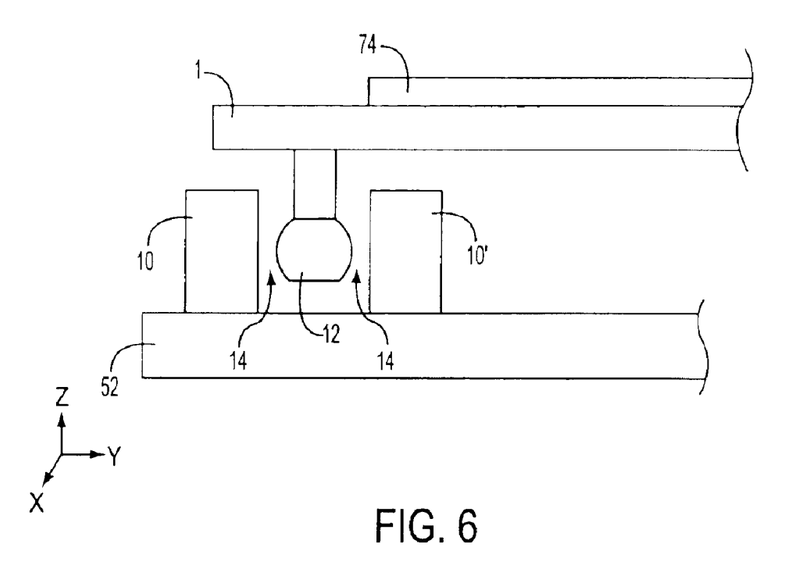
FIG. 6 is a side view illustrating the orientation of the I-shaped magnetic member and the E-shaped electromagnetic actuator in a normal position, in accordance with one embodiment of the present invention.

FIG. 6 illustrates the position of one pair of E-cores 10, 10' and an I-core 12 when the wafer table 1 is parallel with the wafer stage 52. The I-core 12 is attached to the wafer table 1 such that the curved sides of the I-core 12 are adjacent to each E-core 10, 10'. Each E-core 10, 10' and I-core 12 is separated by a gap 14, which allows the I-core 12 to move feely between each E-core 10, 10'. The E-cores 10, 10' are the variable reluctance actuating portions of the magnetic bearing and the reluctance varies with the distance defined by the air gap 14, which also varies the flux and force applied to the I-core 12. The attractive force between the E-core 10, 10' and the I-core 12 is defined by:

$$F = K\,(i/g)^2, \text{ where}$$

F is the attractive force, measured in Newtons;

K=an electromagnetic constant which is dependent upon the geometries of the E-core, I-core, and number of coil turns about the E-core 10, 10' i=current through the E-core, measured in amperes; and g=gap distance, measured in meters.

Figure 7:
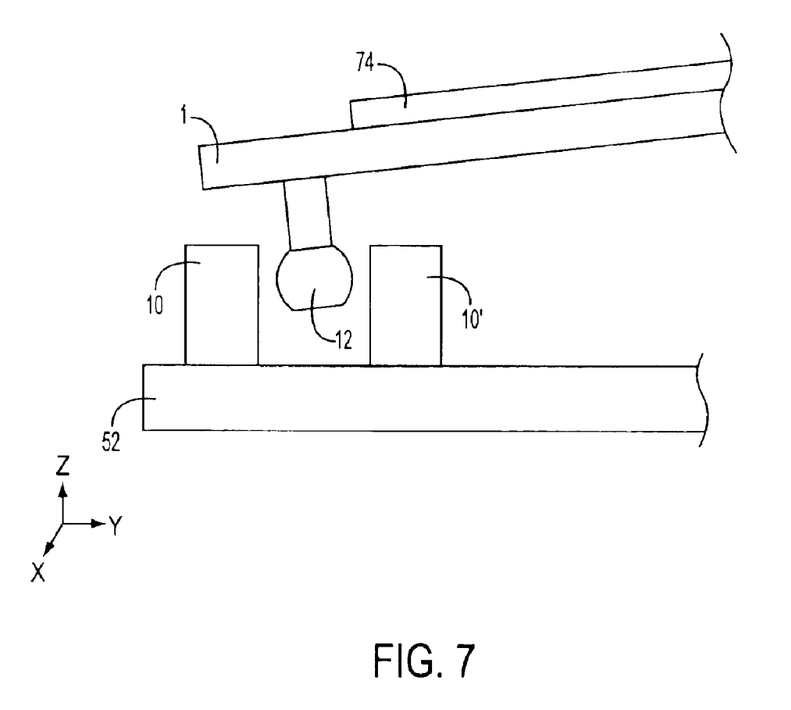
FIG. 7 is a side view illustrating the orientation of the I-shaped magnetic member and the E-shaped electromagnetic actuator activated in the Y and Z positions in accordance with one embodiment of the present invention.

FIG. 7 illustrates the position of one pair of E-cores 10, 10' and an I-core 12 when the wafer table 1 is moved in the Y and Z direction. Movement in the Z direction is accomplished through voice coil motors (not shown) and Y movement is accomplished by two pairs of E-cores 10, 10', which are aligned parallel with the X direction of the wafer table 1. When the two pairs of E-cores 10, 10' are energized by an electrical current, a magnetic flux is produced and an attractive force on the I-core 12 occurs in accordance with the formula given, resulting+ in linear actuation in the Y direction. In this example, the Y movement is away from the outer periphery of the wafer stage, therefore the inner E-core 10' is energized with a higher electrical current than the outer E-core 10. This results in a differential magnetic flux having a force that draws the I-core 12 closer to the inner E-core 10' than the outer E-core 10. As mentioned above, the wafer table movement in the Z direction is accomplished through the activation of voice coil motors.

Although the I-core is now closer to the inner E-core 10' and has also moved slightly upward, the curved sides of the I-core 12 help to maintain the magnetic force geometry between both pairs of E-cores 10, 10'. The size of the gap between the I-core 12 and the pair of E-cores 10, 10' will change, resulting in a change in magnetic force acting on the I-core. However, the magnetic force will continue to act on the same I-core geometry (due to the curved sides). Therefore, the acting magnetic force has less of a tendency to induce torque to the I-core 12. If the I-core in the present invention is replaced by the I-core in the prior art, the geometry of which is shown in FIG. 4, the geometry of the magnetic force acting on the I-core side will change. In the prior art case, the lower right side portions of the I-core will be closer to the inner E-core 10' and the upper right side portions will be further away from the inner E-core 10'. Oppositely, the upper left side portions of the I-core will be closer to the outer E-core 10 and the lower left side portions will be further away from the outer E-core 10. The end result is the introduction of torque to the I-core.

Figure 8:
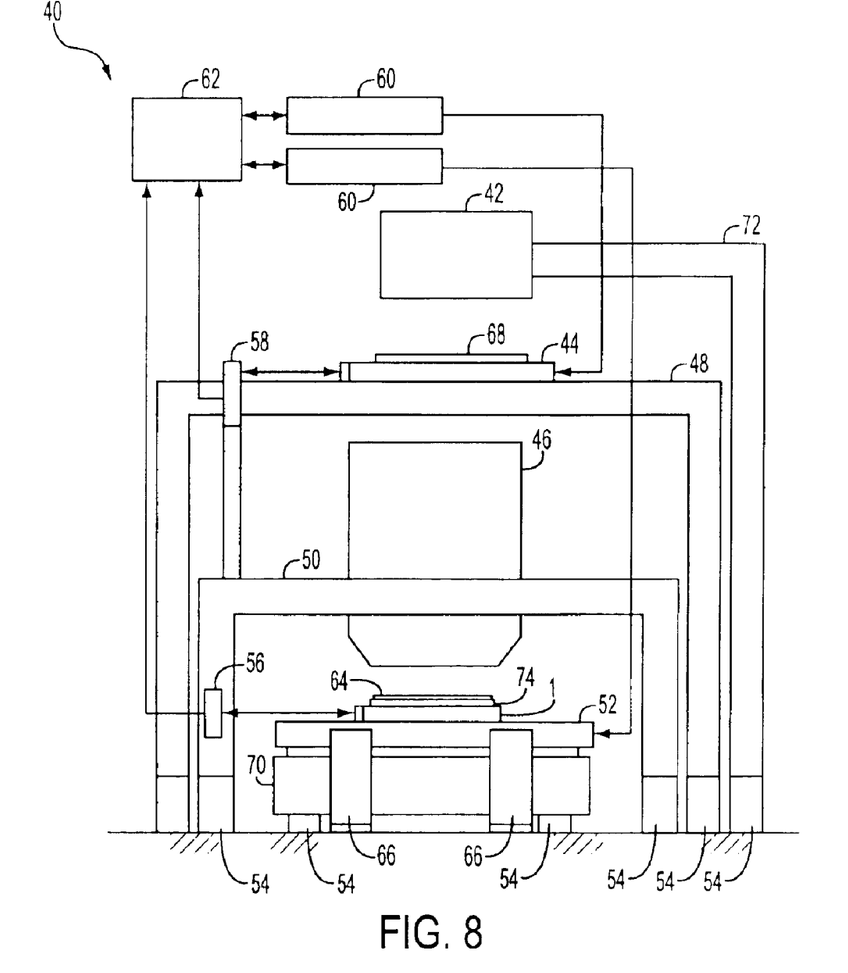
FIG. 8 is a schematic view illustrating a typical photolithography apparatus incorporating the electromagnetic bearing system in accordance with the principles of the present invention.

FIG. 8 is a schematic view illustrating a photolithography apparatus 40 incorporating a wafer positioning stage 52 that is driven by a planar motor and a wafer table 1 that is magnetically coupled to the wafer positioning stage 52 in accordance with the principles of the present invention. The planar motor drives the wafer positioning stage 52 by an electromagnetic force generated by magnets and corresponding armature coils arranged in two dimensions. A wafer 64 is held in place by a wafer chuck 74 which is attached to the wafer table 1. The wafer positioning stage 52 is structured so that it can move in multiple (e.g. three to six) degrees of freedom under precision control by a drive control unit 60 and system controller 62, and position the wafer 64 at a desired position and orientation relative to the projection optics 46.

The wafer table 1 is levitated in the vertical plane by preferably three voice coil motors (not shown). At least three magnetic bearings (not shown) couple and move the wafer table 1 horizontally. The motor array of the wafer positioning stage 52 is supported by a base 70. The reaction force generated by the wafer stage 52 motion can be mechanically released to the ground through a frame 66, in accordance with the structure described in JP Hei 8-166475 and U.S. Pat. No. 5,528,118, the entire contents of which are incorporated by reference herein.

An illumination system 42 is supported by a frame 72. The illumination system 42 projects a radiant energy (e.g. light) through a mask pattern on a reticle 68 that is supported by and scanned using a reticle stage 44. The reaction force generated by motion of the reticle stage can be mechanically released to the ground through the isolator 54, in accordance with the structures described in JP Hei 8-330224 and U.S. Pat. No. 5,874,820, the entire contents of which are incorporated by reference herein. The light is focused through a projection optical system 46 supported on a projection optics frame 50 and released to the ground through frame 54.

The magnification of the projection optical system is not limited to a reduction system. It could be a 1X or a magnification system. When far ultra-violet rays such as excimer laser is used, glass materials such as quartz and fluorite that transmit far ultra-violet rays should be used. When F2 laser or X-ray is used, the optical system should be either catadioptric or refractive (the reticle should also be a reflective type). When an electron beam is used, electron optics should consist of lenses and deflectors, and the optical path for the electron beam should be in a vacuum. The light exposes the mask pattern onto a layer of photoresists on a wafer 64. The light source for the photolithography system may be the g-line (436 nm), I-line (365 nm), KrF excimer laser (248 nm), ArF excimer laser (193 nm) and F2 laser (157 nm). For certain lithography systems, charged particle beams such as X-ray and electron beam may be used. For instance, for electron beam lithography, thermionic emission type lanthanum hexaboride (LaB6) or tantalum (Ta) can be used as an electron gun. Further, for electron beam lithography, the structure could be such that either a mask is used or a pattern can be directly formed on a substrate without the use of a mask.

An interferometer 56 is supported on the projection optics frame 50 and detects the position of the wafer table 1 and outputs the information of the position of the wafer table 1 to the system controller 62. A second interferometer 58 is supported on the reticle stage frame 48 and detects the position of the reticle stage 44 and outputs the information of the position to the system controller 62.

There are a number of different types of lithographic devices in which the present invention may be deployed. For example, the exposure apparatus 40 can be used as scanning type photolithography system that exposes the pattern from the reticle onto the wafer with the reticle and wafer moving synchronously. In a scanning type lithographic device, the reticle is moved perpendicular to an optical axis of the projection optics 46 by the reticle stage assembly 44 and the wafer is moved perpendicular to an optical axis of the projection optics 46 by the wafer stage assembly (1, 52). Scanning of the reticle and the wafer occurs while the reticle and the wafer are moving synchronously.

Alternately, the exposure apparatus 40 can be a step-and-repeat type photolithography system that exposes the reticle while the reticle and the wafer are stationary. In the step and repeat process, the wafer is in a constant position relative to the reticle and the projection optics 46 during the exposure of an individual field. Subsequently, between consecutive exposure steps, the wafer is consecutively moved by the wafer stage perpendicular to the optical axis of the projection optics 46 so that the next field of the wafer 64 is brought into position relative to the projection optics and the reticle for exposure. Following this process, the images on the reticle are sequentially exposed onto the fields of the wafer so that the next field of the wafer is brought into position relative to the projection optics 46 and the reticle.

Further, the present invention can also be applied to a proximity photolithography system that exposes a mask pattern by closely locating a mask and a substrate without the use of a lens assembly.

The use of the exposure apparatus 40 provided herein is not limited to a photolithography system for semiconductor manufacturing. The exposure apparatus 40, for example, can be used as an LCD photolithography system that exposes a liquid crystal display device pattern onto a rectangular glass plate or a photolithography system for manufacturing a thin film magnetic head.

As described above, a photolithography system according to the above-described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9:
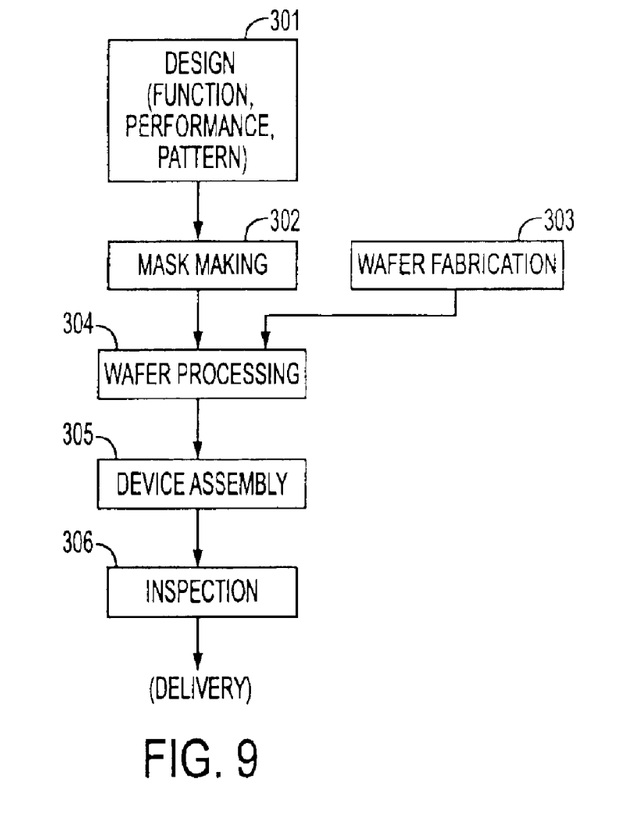
FIG. 9 is a block diagram of a general fabrication process for semiconductor devices.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 10:
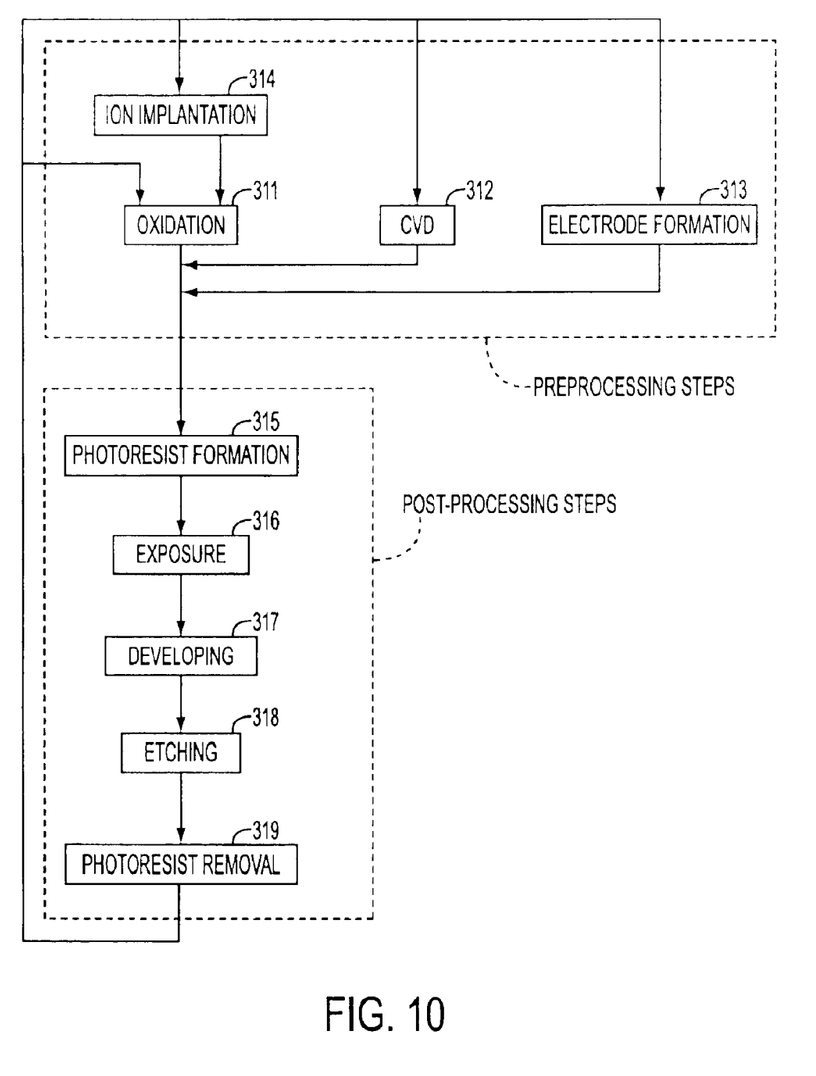
FIG. 10 is a detailed block diagram of fabricating semiconductor devices.

FIG. 10 illustrates a detailed flowchart example of the above-mentioned step 304 in the case of fabricating semiconductor devices. In FIG. 10, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

In summary, the present invention provides a method of minimizing torque to the wafer table. The curved I-core provides a more uniform magnetic coupling between the pair of E-cores and I-cores. The two sides of the I-core that face the pair of E-cores are curved such that as the I-core moves in different directions, the magnetic force acting on the I-core remains generally unchanged. Although the gap between the I-core and E-core can change, the geometry of the I-core remains the same, reducing the tendency of torque applied on the I-core.

Although the invention has been described with reference to a wafer table supported by a wafer stage in a photolithography apparatus, the invention is also applicable to other forms of apparatus in which precision positioning and maintaining of an object is necessary.

While the present invention has been described with respect to the preferred embodiment in accordance therewith, it will be apparent to those in the skilled art that various modifications and improvements may be made without departing from the scope and spirit of the invention. Accordingly, the disclosed invention is to be considered merely as illustrative and limited in scope only as specified in the appended claims.

What is claimed is:

1. An actuator device comprising:
   a first member that includes at least one electromagnet; and
   a second member that is magnetically coupled to the first member and movable relative to the first member in a first direction by a force generated and directed in the first direction by the at least one electromagnet, the second member including a curved outer periphery facing the at least one electromagnet generating the force;
   wherein a relative motion between the first member and the second member has a predetermined range of rotational movement about an axis in a second direction orthogonal to the first direction; and the force between the curved outer periphery of the second member and the at least one electromagnet remains substantially same amount over the predetermined range of rotational movement.

2. The actuator device according to claim 1, wherein the first member includes a pair of electromagnets; and the second member is disposed between the electromagnets.

3. The actuator device according to claim 1, wherein the force is an attractive force that attracts the second member.

4. A stage system including the actuator device of claim 1.

5. A lithography system comprising:
   an illumination system that irradiates radiant energy; and
   the stage system according to claim 4, said stage system carrying an object disposed along a path of said radiant energy.

6. A device on which an image has been formed by the lithography system of claim 5.

7. A positioning system comprising:
   a first part;
   a second part that is movable relative to the first part at least in a first translational and second rotational degrees of freedom; and
   a first actuator having an electromagnet that is connected to one of the first part and the second part and a magnetic member that is connected to the other of the first part and the second part, the first actuator generating a force that causes a first movement on the second part relative to the first part in the first translational degree of freedom;
   wherein the magnetic member has a curved outer periphery that faces the electromagnet, and the force acting between the electromagnet and the curved outer periphery of the magnetic member remains relatively unchanged over a second movement of the second part relative to the first part in the second rotational degree of freedom.

8. The positioning system according to claim 7, wherein the second part moves relative to the first part along a first axis that is parallel with the direction of the force generated by the first actuator in the first movement, and the second part rotates relative to the first part about a second axis that differs from the first axis in the second movement.

9. The positioning system according to claim 8, further comprising a second actuator;
   wherein a part of the second actuator being connected to one of the first part and the second part, and the second actuator generating a second force that causes the second movement on the second part relative to the first part in the second rotational degree of freedom.

10. The positioning system according to claim 7, wherein the curved outer periphery of the magnetic member has a convex shape.

11. The positioning system according to claim 10, wherein the magnetic member is spherical in shape.

12. The positioning system according to claim 10, wherein the magnetic member is cylindrical in shape.

13. The positioning system according to claim 12, wherein the first actuator includes at least two electromagnets, and the cylindrical magnetic member extends axially between the electromagnets and the curved outer periphery of the cylindrical magnetic member faces the electromagnets.

14. A stage system comprising;
   a stage movable relative to a stationary part in at least two degrees of freedom;
   a table member that supports an object; and
   the positioning system according to claim 7, wherein the stage includes one of the first part and the second part of the positioning system and the table includes the other of the first part and the second part, and the table is movable relative to the stage at least in the first translational and second rotational degrees of freedom.

15. The stage system according to claim 14, wherein the table is movable relative to the stage in a vertical direction that includes motion in the second rotational degree of freedom and a horizontal plane including motion in the first translational degree of freedom.

16. A lithography system comprising:
   an illumination system that irradiates radiant energy; and
   the positioning system according to claim 7, the positioning system positioning an object relative to the path of the radiant energy.

17. A device manufactured with the lithography system of claim 16.

18. A wafer on which an image has been formed by the lithography system of claim 16.

19. An actuator device that positions an object in a X-Y plane, comprising:
   a first member that includes at least one electromagnet; and
   a second member that is magnetically coupled to the first member and movable relative to the first member by a force generated by the at least one electromagnet in a Y direction, wherein a relative motion between the first member and the second member includes a relative rotational movement about a X direction; and the force between the second member and the at least one electromagnet remains substantially same amount over the relative rotational movement between the first member and the second member.

20. A stage system including the actuator device of claim 19.

21. A lithography system comprising:
   an illumination system that irradiates radiant energy; and
   the stage system according to claim 20, said stage system carrying an object disposed along a path of said radiant energy.

22. A device on which an image has been formed by the lithography system of claim 21.

23. Method of positioning a first part relative to a second part with respect to a X-Y plane, comprising:
   driving a first actuator, the first actuator having an electromagnet that is connected to one of the first part and the second part and a magnetic member that is connected to the other of the first part and the second part, the first actuator generating a force that causes a first movement on the second part relative to the first part in a first translational degree of freedom in the X-Y plane;
   causing a movement on the second part relative to the first part in a second rotational degree of freedom out of the X-Y plane; wherein the force acting on the magnetic member remains substantially same amount over the movement in the second rotational degree of freedom.

24. The method according to claim 23, wherein the magnetic member has a curved outer periphery that faces on the electromagnet.

25. The method for operating a lithography system comprising the positioning method of claim 23.

26. The method according to claim 23, wherein remaining same amount of the force prevents the first actuator from inducing a torque between the first part and the second part.

27. A method for making a device including at least the photolithography process, wherein the photolithography process utilizes the method of operating a lithography system of claim 26.

28. A method for making a wafer utilizing the method of operating a lithography system of claim 26.

* * * * *